United States Patent [19]

Ashton et al.

[11] Patent Number: 4,575,647

[45] Date of Patent: Mar. 11, 1986

[54] REFERENCE-REGULATED COMPENSATED CURRENT SWITCH EMITTER-FOLLOWER CIRCUIT

[75] Inventors: Gerard J. Ashton, Hopewell Junction; Emilio Colao, Poughkeepsie; Joseph R. Cavaliere, Hopewell Junction, all of N.Y.

[73] Assignee: International Business Machines Corporation, Armonk, N.Y.

[21] Appl. No.: 512,071

[22] Filed: Jul. 8, 1983

[51] Int. Cl.$^4$ .................. H03K 19/003; H03K 19/086
[52] U.S. Cl. .................................... 307/443; 307/455; 307/297; 307/491
[58] Field of Search ............... 307/443, 455, 467, 362, 307/364, 491; 330/261

[56] References Cited

U.S. PATENT DOCUMENTS

| | | | |
|---|---|---|---|
| 3,259,761 | 7/1966 | Narud et al. | 307/455 |
| 3,522,446 | 8/1970 | Kodama | 307/455 |
| 3,560,770 | 2/1971 | Gieles | 307/455 |
| 3,579,272 | 5/1971 | Foss | 307/455 |
| 3,590,274 | 6/1971 | Marley | 307/455 X |
| 3,778,646 | 12/1973 | Masaki | 307/455 |
| 4,249,091 | 2/1981 | Yamagiwa | 307/362 X |

FOREIGN PATENT DOCUMENTS 0064126  11/1982  European Pat. Off. ............ 330/261

OTHER PUBLICATIONS

Betts et al, "Emitter-Coupled Logic Circuit", *IBM Tech. Discl. Bull.;* vol. 15, No. 7, pp. 2178-2179; 12/1972.

*Primary Examiner*—Larry N. Anagnos
*Attorney, Agent, or Firm*—Sughrue, Mion, Zinn, Macpeak and Seas

[57] ABSTRACT

A network composed of a plurality of compensated current switch emitter-follower logic circuits and a generator of a current source control potential for the current sources of the logic circuits in which a symmetrical relationship between UP and DOWN logic levels is maintained at all times. A logic level tracking signal which tracks changes in the UP and DOWN logic levels in the logic circuits is produced by simulating at least a portion of one of the logic circuits. The logic level tracking signal is compared with the reference potential used for the logic levels, preferably ground, by a differential amplifier. The output of the differential amplifier is buffered and suitably level shifted to produce the current source control potential. The current source control potential is applied from the single control potential generator to each of the logic circuits. The control potential is also applied to the control input of a current source portion of the simulating circuit.

17 Claims, 5 Drawing Figures

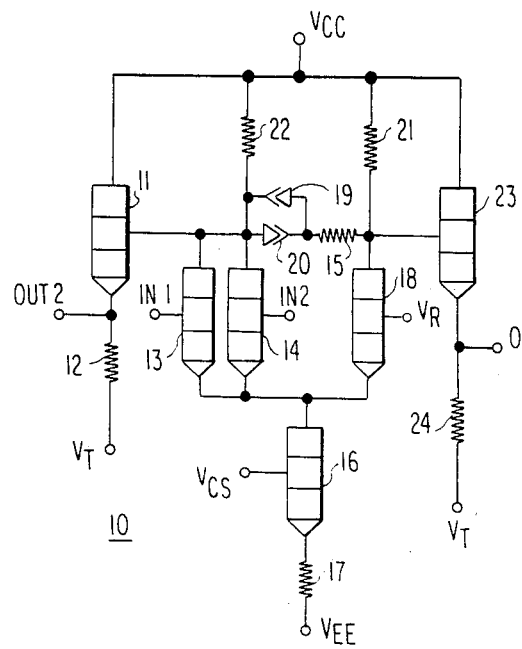
FIG. 1
PRIOR ART
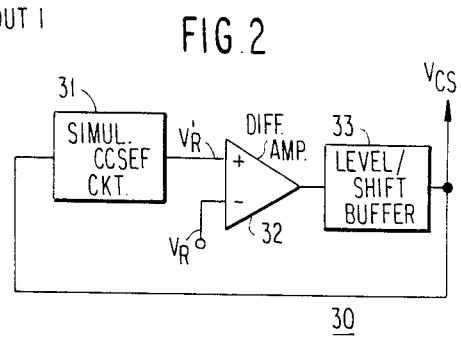
FIG. 2
FIG. 3
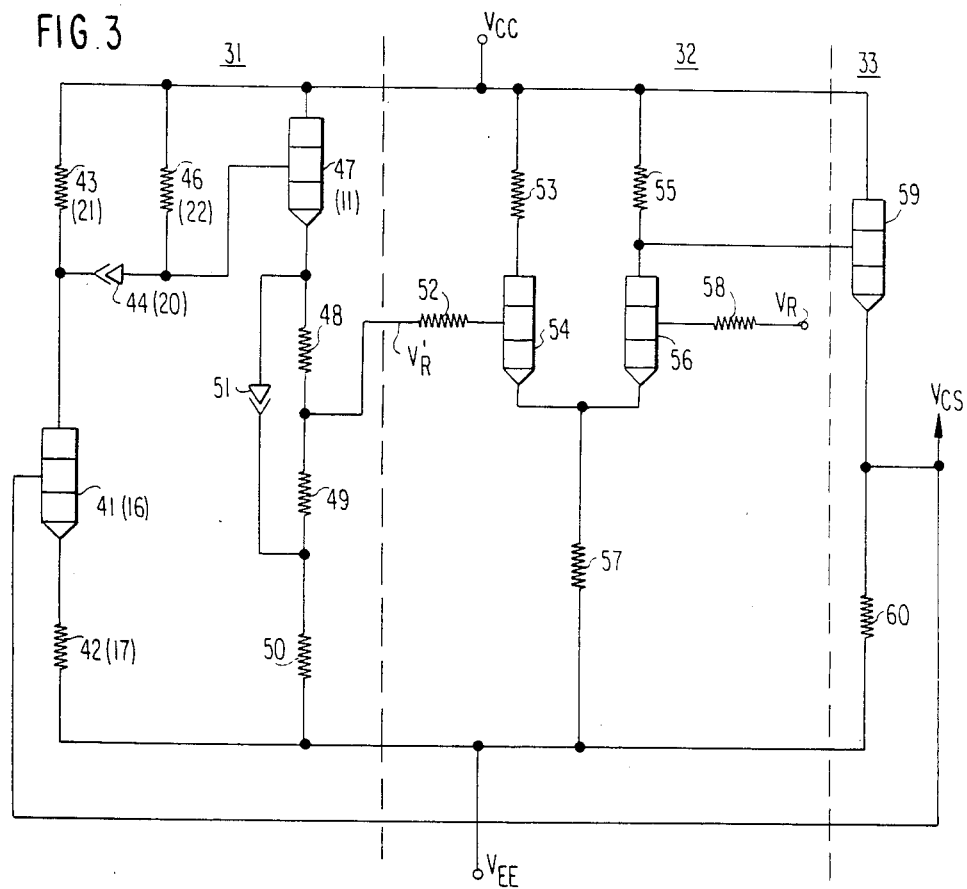

REFERENCE-REGULATED COMPENSATED CURRENT SWITCH EMITTER-FOLLOWER CIRCUIT

BACKGROUND OF THE INVENTION

The invention pertains most broadly to a compensated current switch emitter-follower (CCSEF) logic network having a reduced signal swing and, correspondingly, a reduced circuit delay time. More specifically, the invention pertains to such a logic network in which UP and DOWN logic levels are controlled so as to be precisely symmetrical around a reference level at all times. Yet more specifically, the invention pertains to such a logic network in which a reference voltage is supplied from "off-chip", while logic signal swings are held to a narrow range without affecting the noise margin of the various circuits which make up the network.

Compensated current switch emitter-follower logic circuits have been known for some time. An example of such a logic circuit is described by Muller et al., "Fully Compensated Emitter-Coupled Logic: Eliminating the Drawbacks of Conventional ECL", *IEEE Journal of Solid-State Circuits*, Vol. SC-8, No. 5, October 1973, pp. 362–367, and shown in FIG. 1 herein. In this circuit, input transistors 13 and 14 are coupled in parallel with one another. The bases of the transistors 13 and 14 are connected to input terminals IN 1 and IN 2 to which two input logic signals are applied. The commonly connected collectors of the transistors 13 and 14 are coupled through a resistor 22 to a terminal to which a positive power supply voltage $V_{CC}$ is applied. The transistors 13 and 14 are connected in a differential amplifier configuration with a third transistor 18, the collector of which is coupled through a resistor 21 to the $V_{CC}$ terminal. The base of the transistor 18 is connected to a logic level reference potential $V_R$, here assumed to be ground although other potentials may be used. Diodes 19 and 20 are connected back to back between the collector of the transistor 18 and the commonly connected collectors of the transistors 13 and 14 through a resistor 15. The emitters of all three transistors 13, 14 and 18 are connected to the collector of a transistor 16, the latter device serving as a constant current source for the differential amplifier circuit. The emitter of the transistor 16 is connected through a resistor 17 to a power supply terminal to which a negative supply voltage $V_{EE}$ is applied. A reference voltage $V_{CS}$ is applied to the base of the transistor 16. Varying $V_{CS}$ will cause the UP and DOWN output logic levels to simultaneously vary. Two output transistors 11 and 23 are provided, both of these being connected in an emitter-follower configuration with their emitters coupled through resistors 12 and 24, respectively, to a fixed potential $V_T$. The base input to the transistor 11 is supplied from the commonly connected collectors of the transistors 13 and 14, while the base input to the transistor 23 is supplied from the collector of the transistor 18. The emitters of the transistors 11 and 23 are connected to output terminals OUT 2 and OUT 1, respectively.

In operation, when at least one of the input signals applied to the terminals IN 1 and IN 2 is in the UP (positive) state, the corresponding transistor 13 or 14 is turned on, thereby causing most of the current which flows through the constant current source transistor 16 to flow through the respective transistor 13 or 14 and the resistor 22. The transistor 18 is then off and the transistor 23 on, thereby causing the output signal on the terminal OUT 1 to be at the UP level. The voltage at the base of transistor 11 is lower than the voltage at the base of transistor 23, and therefore terminal OUT 2 is at the DOWN level. In this manner, the logical OR of the signals on the input terminals IN 1 and IN 2 is produced on the terminal OUT 1 and the logical NOR of those signals on the terminal OUT 2.

The transistor 18 is turned off in the case that an UP level is applied to the base of one of the transistors 13 and 14, in which case the collector of the transistor 18 is pulled in the negative direction by the diode 19. Similarly, when the transistor 18 is on and both the transistors 13 and 14 are off in the case that DOWN-level signals are applied to both input terminals IN 1 and IN 2, the commonly connected collectors of the transistors 13 and 14 are pulled in the negative direction by the diode 20. This limits the voltage swings in the circuit, thereby reducing the switching (delay) times through the circuit.

Ordinarily, there are, of course, many circuits such as the one shown in FIG. 1 on a single integrated circuit chip. In one prior art approach, it was the practice to provide on each chip a reference voltage generator for supplying the voltage $V_{CS}$ for use by all current source transistors of all logic circuits on the chip. This approach suffers a drawback in that, due to possible variations in the power supply voltage $V_{CC}$ within a logic network composed of multiple chips, and due to differences among chips such as differences in resistor values or the like, the output UP and DOWN levels may be different for different ones of the chips. This imposes the condition that a relatively large difference between UP and DOWN output levels must be maintained in order to ensure successful communication among chips. In the circuit of FIG. 1, the difference between the UP and DOWN levels is determined by the drop across one of the diodes 19 and 20 plus the drop across the resistor 15. Thus, to provide a sufficiently great difference between the UP and DOWN levels using this prior art technique, the resistor 15 must have a relatively high value.

Various circuits have been proposed for generating a current source control potential such as $V_{CS}$ in FIG. 1. One simple and straightforward approach is to connect the cathode of a diode to $V_{EE}$, and the anode of the diode to the terminal to which $V_{CS}$ is to be furnished and through a resistor to $V_{CC}$. Plural diodes connected in series may be employed. This technique, however, has a drawback in that the $V_{CS}$ thus generated does not track changes in $V_{CC}$. Another approach is simply to connect two resistors in series between $V_{CC}$ and $V_{EE}$ in a voltage-divider configuration with the voltage division point connected to the $V_{CS}$ terminal. Although changes in both $V_{CC}$ and $V_{EE}$ can be tracked in this manner, effectively no temperature compensation is provided. In either case, because the value of $V_{CS}$ produced is not fully compensated for changes in both power supply levels and temperature, the UP and DOWN levels produced by the circuits which employ the current source control potential so generated will tend to shift in a nonsymmetrical manner with respect to the logic signal reference level (ground for the case of the circuit of FIG. 1). This is, of course, an undesirable phenomena in that the noise margin for the circuit is adversely affected.

Accordingly, it is an object of the present invention to provide a logic network employing CCSEF logic circuits in which a single current source control potential generator is provided for a plurality of logic circuits and in which small logic level signal swings can be employed without adversely affecting the noise margin of the various circuits of which the network is composed.

Yet further, it is an object of the present invention to provide such a network in which a single current source control potential generator is provided for a plurality of logic circuits, which current source control potential generator includes compensation for variations in both positive and negative supply voltages as well as for temperature.

SUMMARY OF THE INVENTION

These, as well as other objects of the invention, are met by a logic circuit network including a plurality of logic circuits, each of which includes provision for shifting the UP and DOWN logic levels produced by the circuit simultaneously in response to a control potential applied thereto, and means for supplying the control potential to each of the logic circuits at a level which maintains the UP and DOWN levels produced by each of the logic circuits in a symmetrical relationship with respect to a logic signal reference potential.

Preferably, each of the logic circuits is a compensated current switch emitter-follower circuit having a logic signal switching portion and a current source for supplying current to the logic signal switching portion, the control potential being applied to a control input of the current source. The logic signal switching portion employs a differential amplifier configuration driving emitter-follower output transistors. The current source performs the shifting function. The means for supplying the control potential is implemented as a circuit for producing a logic level tracking signal which tracks the changes in the UP and DOWN logic levels in the logic circuits. This may be done by simulating a portion of one of the logic circuits which produces an output signal from the logic circuit in a predetermined state, the UP level in preferred embodiments described. By simulating or simulation is herein meant that a circuit is constructed which has the same operative configuration, or equivalent circuit, as that portion of one of the logic circuits which produces the output signal in question. Because the use of the invention results in the UP and DOWN levels of the logic circuits being maintained in a symmetrical relationship with respect to a logic level reference potential (ground) at all times, a small difference between the UP and DOWN logic levels may be employed. This may be done by inserting Schottky-barrier diodes back to back directly between collectors of the differential amplifier transistors in the logic circuits.

BRIEF DESCRIPTION OF THE DRAWINGS

FIG. 1 is a circuit diagram of a prior art CCSEF logic circuit;

FIG. 2 is a block diagram of a current source control potential generator of the invention;

FIGS. 3-5 are, respectively, circuit diagrams of first through third embodiments of a current source control potential generator of the invention.

DESCRIPTION OF THE PREFERRED EMBODIMENTS

Figure 4:
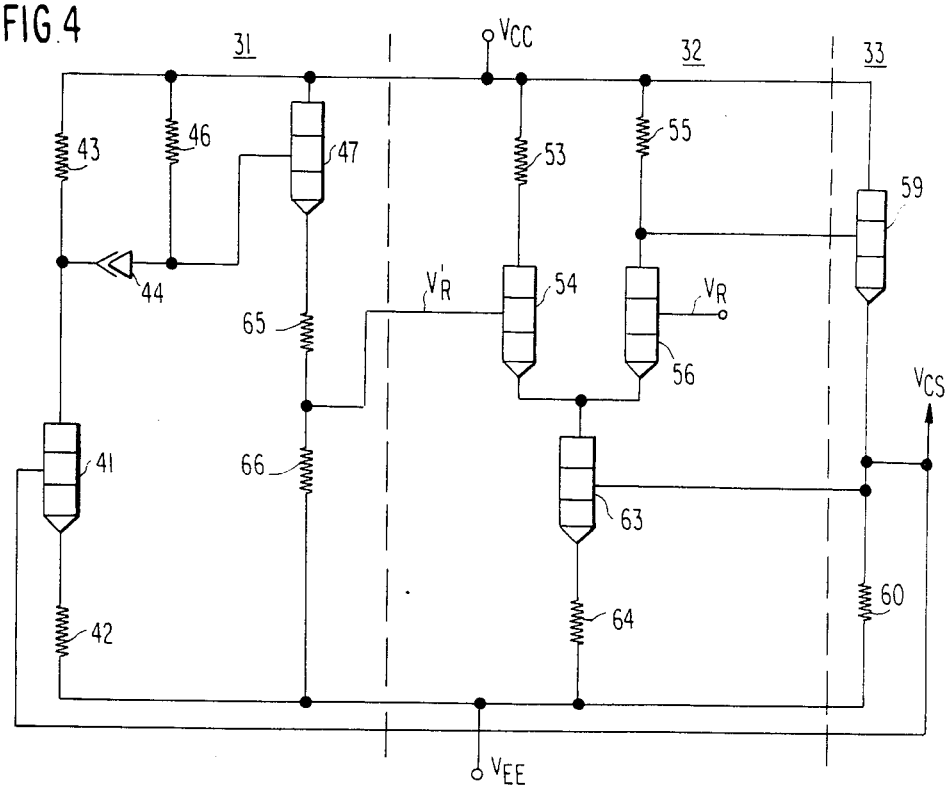

Referring now to FIG. 2, there is shown therein a block diagram of a current source control potential generator constructed in accordance with the teachings of the invention. The circuit includes three sections: a simulated CCSEF circuit 31, a differential amplifier 32 and a level shifter/buffer circuit 33. $V_{CS}$ is produced on the output of the level shifter/buffer circuit 33 and applied to many different logic circuits throughout the network for which the generator is employed, which may include circuits on different chips. $V_{CS}$ is also fed back to the input of the simulated CCSEF circuit 31. It is the function of the simulated CCSEF circuit 31 to produce a logic level tracking signal $V_R'$ which is equal to the logic signal reference potential $V_R$ in the case that $V_{CC}$ and $V_{EE}$ are at preferred values and for a given temperature, and which deviates from $V_R$ otherwise in such a manner as to maintain the UP and DOWN levels in the circuits which employ $V_{CS}$ symmetrical with respect to $V_R$. It can readily be appreciated that if the UP and DOWN logic levels are symmetrical with respect to $V_R$, a minimal potential difference therebetween can be employed.

With reference now to FIG. 3, a first embodiment of a current source control potential generator of the invention will now be described. The simulated CCSEF circuit 31 is constructed by simulating that portion of the CCSEF circuit of FIG. 1 which is in the active state at any one time, that is, by simulating that portion of the circuit needed to produce an output UP logic level. This is done by arranging circuit components, including transistors 41 and 47, resistors 42, 43 and 46, and a Schottky-barrier diode 44, in a configuraion which is equivalent to the circuit of the current source transistor 16, resistor 17, one of the transistors 13 and 14, the diode 19, the resistors 21 and 22, the emitter-follower transistor 23 and the output resistor 24 in FIG. 1. (In FIG. 3, the reference numerals of the components of FIG. 1 which are simulated by corresponding elements are shown in parentheses.) It may be noted that there is no actual component in FIG. 3 corresponding to one of the transistors 13 and 14, only a wired connection. This is due to the fact that there is very little base current in a bipolar transistor when it is in its active region, and the collector is nearly equal to the emitter current. Hence, the effect of such a base current can in many cases be assumed to be negligible. However, if desired, a transistor can be inserted in series with the transistor 41 in FIG. 3 with an UP level applied to its base so as to simulate the presence of the transistor 13 or 14.

The simulated CCSEF circuit 31 differs from the configuration of FIG. 1 in that the resistor 24 of FIG. 1 has been replaced by three resistors 48, 49 and 50 connected in series between the emitter of the transistor 47 and the $V_{EE}$ terminal, and in that a Schottky-barrier diode 51 is connected across the resistors 48 and 49. The value of the resistors 48, 49 and 50 should though be chosen so that the potential at the emitter of the transistor 47 is the same as that at the emitter of the transistor 23 for standard conditions (preferred values of $V_{CC}$ and $V_{EE}$ and a standard temperature).

The voltage $V_R'$ is produced at the voltage division point of the resistors 48 and 49. This voltage is applied through a resistor 52 to a transistor 54 which forms one leg of a differential amplifier circuit, the other leg being constituted by a transistor 56, the base of which receives the logic signal reference voltage $V_R$ (ground) through a resistor 58. The emitters of the transistors 54 and 56 are connected in common through a resistor 57 to the $V_{EE}$ terminal. The collectors of the transistors 54 and 56 are coupled through respective resistors 53 and 55 to the $V_{CC}$ terminal. The output of the differential amplifier circuit 32 at the collector of the transistor 56 is applied to the base of an emitter-follower transistor 59, the latter, together with a resistor 60, constituting the level shifter/buffer circuit. The desired current source control potential $V_{CS}$ is produced at the emitter of the transistor 59.

Because many logic circuits will ordinarily employ the potential $V_{CS}$, the transistor 59, and the transistor 56 of the differential amplifier circuit 32 which drives it, should have a large drive capacity. This, however, presents no difficulty because, with the invention, it is necessary to provide only a single current source control potential generator for a plurality of logic circuits.

It should also be noted that in the simulated CCSEF circuit of FIG. 3 that there is no resistor in series with the Schottky-barrier diode 44. This is due to the fact that, when the current source control potential generator of the invention is employed, minimal differences between UP and DOWN logic levels can be used, that is, the resistor 15 (FIG. 1) may be a short circuit in CCSEF circuits which use $V_{CS}$ produced by the current source control potential generator of the invention. Thus, the difference between $V_{UP}$ (UP logic level) and $V_{DOWN}$ (DOWN logic level) can be made equal to $V_{SBD}$, where $V_{SBD}$ is the voltage drop across a Schottky-barrier diode.

The voltage at the emitter of the transistor 47 will be the same as the UP level for the CCSEF circuit of FIG. 1 since both are using as a current source reference potential the same $V_{CS}$. Because $V_{UP} - V_{DOWN} = V_{SBD}$, the voltage across the Schottky-barrier diode 51 in FIG. 3 is equal to the difference between the UP and DOWN levels. By making the resistance values of the resistors 48 and 49 equal, the potential $V_R'$ at their voltage division point will be precisely halfway between the actual UP and DOWN levels, both for the circuit of FIG. 3 and for the circuit of FIG. 1. Thus, $V_R'$ will track any variations in $V_{UP}$ and $V_{DOWN}$ precisely. $V_R'$ is compared with the logic reference level $V_R$ (ground) by the differential amplifier 32. The amplifier signal is shifted and buffered by the transistor 59 to generate $V_{CS}$.

If, for instance, $V_{UP}$ and $V_{DOWN}$ become too positive due to an increase in $V_{CC}$, $V_R'$ will shift in the positive direction. This has the effect of increasing $V_{CS}$, thereby shifting $V_{UP}$ and $V_{DOWN}$ negatively to maintain them in a symmetrical relationship with respect to $V_R$. Similarly, if $V_{UP}$ and $V_{DOWN}$ shift negatively due, for instance, to a decrease in $V_{EE}$, $V_{CS}$ will be decreased, thereby forcing $V_{UP}$ and $V_{DOWN}$ in the positive direction. Similarly, compensation is made for level changes due to temperature variations.

In the circuit of FIG. 3, the resistors 52 and 58 are provided for purposes of frequency compensation and to prevent oscillation or ringing from occurring. However, they may be omitted if these factors are not important.

Other circuit configurations are possible to achieve the objects of the invention. In a circuit configuration shown in FIG. 4, the Schottky-barrier diode 51 is omitted and the resistances of the resistors 65 and 66 are chosen so that $V_R' = V_R$ for standard conditions. Also, a current source transistor 63 is inserted in the emitter leg of the differential amplifier circuit. The transistor 63 receives $V_{CS}$ at its base.

Figure 5:
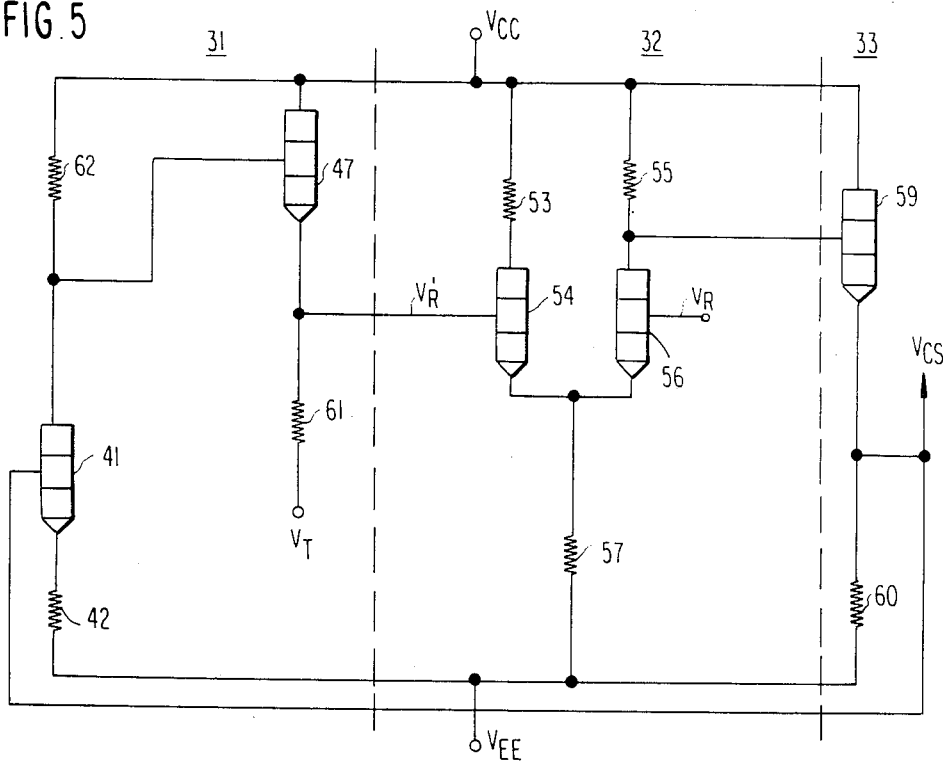

The circuit configuration of FIG. 5 takes advantage of the fact that the output of a CCSEF circuit should be zero when the input voltage is zero. The Schottky-barrier diodes have no voltage across them at that time, and hence they are eliminated in FIG. 5 in a simplification of a simulation of the CCSEF circuit of FIG. 1. In this case, the resistance value of the resistor 62 should be half that of the resistor 22 in FIG. 1 or the resistor 46 in FIG. 3.

This completes the description of the preferred embodiments of the invention. Although preferred embodiments have been described, it is believed that numerous modifications and alterations thereto would be apparent to one of ordinary skill in the art without departing from the spirit and scope of the invention. For instance, it is possible to choose component values such that $V_R'$ is not precisely halfway between UP and DOWN logic levels. This may be advantageous for circuits in which emitter dotting (wired-OR) is employed and a DOWN level can be pulled in the positive direction. In such a situation, it may be desirable to make $V_R'$ slightly more positive than a level halfway between UP and DOWN logic levels.

We claim:

1. A logic circuit network comprising:
   a plurality of logic circuits, each of said logic circuits comprising means for shifting UP and DOWN logic levels produced by said logic circuit in response to a control potential applied to said shifting means; and
   means for supplying said control potential to each of said logic circuits at a level so as to maintain both said UP and DOWN logic levels produced by each of said logic circuits in a predetermined relationship with respect to a logic signal reference potential employed by said logic circuits, said control potential supplying means including means for simulating an output of at least one of said logic circuits at at least one logic level.

2. The logic circuit network of claim 1, wherein each of said logic circuits comprises a compensated current switch emitter-follower circuit having a logic signal switching portion and a current source for supplying current to said logic signal switching portion, said control potential being applied to a control input of said current source.

3. The logic circuit network of claim 1, wherein each of said logic circuits comprises a compensated current switch emitter-follower circuit having at least a first transistor and a second transistor connected in a differential amplifier configuration, a third transistor connected to supply current to emitters of said first and second transistors, and at least one fourth transistor connected in an emitter-follower configuration for buffering an output of one of said first and second transistors.

4. The logic network of claim 3, wherein said simulating means comprises means for producing a logic level tracking signal which simulates changes in said UP and DOWN logic levels in said logic circuits; and wherein said means for supplying said control potential further includes differential amplifier means for comparing said logic level tracking signal with said reference potential; and means for buffering and level shifting an output from said differential amplifier means for producing said control potential.

5. The logic network of claim 3, wherein said simulating means includes at least a pair of transistors connected in the same configuration as said third and fourth transistors of one of said logic circuits.

6. The logic network of claim 5, wherein each of said logic circuits further comprises first and second Schottky-barrier diodes respectively reversely connected directly between collectors of said first and second transistors.

7. The logic network of claim 6, wherein said simulating means comprises a third Schottky-barrier diode connected in series with an emitter of one of said transistors of said simulating means corresponding to said fourth transistor and a voltage divider connected across said third Schottky-barrier diode, said logic level tracking signal being produced at a voltage division point of said voltage divider.

8. The logic network of any one of claims 1 to 7, wherein said predetermined relationship is a symmetrical relationship.

9. A generator of a current source control potential for a logic network composed of a plurality of compensated-current switch emitter-follower logic circuits, comprising:
    means for simulating an output of one of said logic circuits at a predetermined logic level;
    means for comparing said simulated output with a logic signal reference potential for said logic levels provided to said logic circuits; and
    means for buffering and level shifting an output of said comparing means to produce said current source control potential at a level for maintaining UP and DOWN logic levels produced by said logic circuits symmetrical with respect to said reference potential.

10. The current source control potential generator of claim 9, wherein said simulating means circuit configured equivalently to one of said logic circuits.

11. The current source control potential generator of claim 10, wherein said simulating means comprises a first transistor having an emitter resistively coupled to a first, negative power supply terminal, a base supplied with said current source control potential, and a collector supplied with current through a collector resistor from a second, positive power supply terminal; a second transistor having a base coupled to said collector of said first transistor and a collector coupled to said second power supply terminal; and an emitter circuit coupled to an emitter of said second transistor, said simulated output being produced at an output of said emitter circuit.

12. The current source control potential generator of claim 11, wherein said emitter circuit comprises a voltage divider, said simulated output being produced at a voltage division point of said voltage divider.

13. The current source control potential generator of claim 12, further comprising a Schottky-barrier diode connected across said voltage divider.

14. The current source control potential generator of claim 11, further comprising a Schottky-barrier diode coupled between said base of said second transistor and said collector of said first transistor, and resistors coupled between an anode and cathode of said Schottky-barrier diode and said positive power supply terminal, one of said resistors comprising said collector resistor.

15. The current source control potential generator of claim 9, wherein said comparing means comprises a differential amplifier.

16. The current source control potential generator of claim 15, wherein said differential amplifier comprises a current source transistor having a base supplied with said current source control potential.

17. The current source control potential generator of any one of claims 9 to 16, wherein said buffering and level shifting means comprises a transistor connected in an emitter-follower configuration.

* * * * *